(12) United States Patent
Betin et al.

(10) Patent No.: US 7,626,759 B2
(45) Date of Patent: Dec. 1, 2009

(54) OUTCOUPLER WITH BRAGG GRATING AND SYSTEM AND METHOD USING SAME

(75) Inventors: Alexander A. Betin, Manhattan Beach, CA (US); Oleg M. Efimov, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/405,199

(22) Filed: Apr. 17, 2006

(65) Prior Publication Data
US 2006/0187535 A1     Aug. 24, 2006

Related U.S. Application Data

(62) Division of application No. 10/860,468, filed on Jun. 2, 2004, now abandoned.

(51) Int. Cl.
*H01S 3/00* (2006.01)
(52) U.S. Cl. ........................................ 359/346; 372/108
(58) Field of Classification Search ................. 359/346; 372/108
See application file for complete search history.

(56) References Cited

U.S. PATENT DOCUMENTS

| | | | | |
|---|---|---|---|---|
| 4,233,571 A | * | 11/1980 | Wang et al. ................... 372/99 |
| 4,321,550 A | * | 3/1982 | Evtuhov ...................... 359/326 |
| 4,493,085 A | * | 1/1985 | Valley ......................... 372/19 |
| 4,493,086 A | * | 1/1985 | Jain et al. .................... 372/21 |
| 4,716,444 A | * | 12/1987 | Mongeon et al. ........... 356/5.06 |
| 4,734,911 A | * | 3/1988 | Bruesselbach ............... 372/21 |
| 4,740,951 A | * | 4/1988 | Lizet et al. .................... 398/87 |
| 4,757,268 A | * | 7/1988 | Abrams et al. .............. 359/338 |
| 4,792,765 A | * | 12/1988 | Smith et al. ................. 359/346 |
| 4,798,462 A | * | 1/1989 | Byren ................... 356/139.08 |
| 4,838,630 A | * | 6/1989 | Jannson et al. ................. 359/3 |
| 4,902,980 A | * | 2/1990 | O'Meara ..................... 359/338 |
| 4,945,539 A | * | 7/1990 | Bagshaw et al. .............. 372/13 |
| 4,989,216 A | * | 1/1991 | Chandra et al. ............... 372/97 |
| 5,071,248 A | * | 12/1991 | Tiefenthaler et al. ........ 356/128 |
| 5,126,876 A | * | 6/1992 | O'Meara ..................... 359/338 |
| 5,130,849 A | * | 7/1992 | Valley et al. ................ 359/571 |
| 5,153,597 A | * | 10/1992 | Hueber et al. ............... 342/192 |
| 5,174,298 A | * | 12/1992 | Dolfi et al. .................. 600/425 |
| 5,187,760 A | * | 2/1993 | Huber ......................... 385/37 |

(Continued)

OTHER PUBLICATIONS

"Phase Conjugation Based On Thermal Nonlinearity," paper NThB1 presented by A. A. Betin at Nonlinear Optics: Materials, Fundamentals, and Applications Conference, Maui, HI, pp. 336-339, Jul. 1996.

(Continued)

*Primary Examiner*—Jack W. Keith
*Assistant Examiner*—Ari M Diacou
(74) *Attorney, Agent, or Firm*—Leonard A. Alkov (57) ABSTRACT

An outcoupler having a wavelength selective, angle sensitive element or Bragg grating and an arrangement for maintaining the element in a predetermined orientation relative to an incident beam of electromagnetic energy. The Bragg grating may be reflective or transmissive. The inventive outcoupler may be used to implement a phase conjugate master oscillator power amplifier with an oscillator; a resonator in operational alignment with the oscillator; and an outcoupler in alignment with the oscillator. In the best mode, second and third Bragg gratings are included within the oscillator and the resonator, respectively.

14 Claims, 7 Drawing Sheets

U.S. PATENT DOCUMENTS

| | | | | |
|---|---|---|---|---|
| 5,208,881 | A * | 5/1993 | Bruesselbach | 385/27 |
| 5,291,503 | A * | 3/1994 | Geiger et al. | 372/21 |
| 5,307,437 | A * | 4/1994 | Facq et al. | 385/124 |
| 5,377,210 | A * | 12/1994 | Hemmer et al. | 372/3 |
| 5,394,412 | A * | 2/1995 | Huignard et al. | 372/9 |
| 5,430,748 | A * | 7/1995 | MacCormack et al. | 372/29.016 |
| 5,483,342 | A | 1/1996 | Rockwell | |
| 5,511,083 | A * | 4/1996 | D'Amato et al. | 372/6 |
| 5,619,368 | A * | 4/1997 | Swanson | 359/326 |
| 5,689,363 | A * | 11/1997 | Dane et al. | 359/334 |
| 5,701,396 | A * | 12/1997 | Liedenbaum et al. | 706/40 |
| 5,726,795 | A | 3/1998 | Betin et al. | |
| 5,729,380 | A * | 3/1998 | Betin et al. | 359/300 |
| 5,848,204 | A * | 12/1998 | Wanser | 385/12 |
| 5,898,804 | A * | 4/1999 | Wickham | 385/37 |
| 5,912,910 | A * | 6/1999 | Sanders et al. | 372/22 |
| 5,920,588 | A * | 7/1999 | Watanabe | 372/96 |
| 5,974,059 | A * | 10/1999 | Dawson | 372/6 |
| 6,093,927 | A * | 7/2000 | Wickham | 250/227.23 |
| 6,195,200 | B1 * | 2/2001 | DeMarco et al. | 359/337.21 |
| 6,278,547 | B1 | 8/2001 | Betin et al. | |
| 6,321,001 | B1 * | 11/2001 | Heflinger | 385/24 |
| 6,346,686 | B1 * | 2/2002 | Betin et al. | 219/121.61 |
| 6,480,327 | B1 * | 11/2002 | Betin | 359/338 |
| 6,483,629 | B1 * | 11/2002 | Boffi et al. | 359/336 |
| 6,529,314 | B1 * | 3/2003 | Shukunami et al. | 359/332 |
| 6,885,683 | B1 * | 4/2005 | Fermann et al. | 372/25 |
| 2001/0046352 | A1 * | 11/2001 | Ohta et al. | 385/50 |
| 2002/0015205 | A1 * | 2/2002 | Ham | 359/139 |
| 2002/0045104 | A1 * | 4/2002 | Efimov et al. | 430/2 |
| 2002/0172894 | A1 * | 11/2002 | Fallahi et al. | 430/321 |
| 2003/0007541 | A1 * | 1/2003 | Sousa et al. | 372/94 |
| 2003/0021302 | A1 * | 1/2003 | Grudinin et al. | 372/6 |
| 2003/0031411 | A1 * | 2/2003 | Arbore et al. | 385/37 |
| 2003/0063642 | A1 * | 4/2003 | Aggerstam et al. | 372/45 |
| 2003/0068129 | A1 * | 4/2003 | Bhagavatula et al. | 385/37 |
| 2004/0091000 | A1 * | 5/2004 | Kuksenkov | 372/3 |
| 2004/0114644 | A1 * | 6/2004 | Kwon et al. | 372/20 |
| 2005/0063446 | A1 * | 3/2005 | Betin et al. | 372/98 |

OTHER PUBLICATIONS

"Phase Conjugation of Depolarized Light with a Loop PC", published by A. A. Betin, S. C. Matthews, and M. S. Mangir in Nonlinear Optics: Materials, Fundamentals, and Applications Conference, Kauai, Hawaii, Jul. 1998.

"Laser Interferometer with Wavelength-Reversing Mirrors," Basov et al, Sov. Phys. JTEP, vol. 52, No. 5, Nov. 1980, pp. 847-851.

"Coupled Wave Theory for Thick Hologram Gratings," published by H. Kogelnik in The Bell System Technical Journal, v.48, No. 9, pp. 2909-2945, (1969).

"High-Efficiency Bragg Gratings In Photothermo-Refractive Glass," published by O.M. Efimov, L.B. Glebov, L.N. Glebova, K.C. Richardson, V.I. Smirnov in Appl. Opt., v. 38, No. 4, pp. 619-627 (1999).

See "Simple Technique for Apodising Chirped and Unchirped Fiber Bragg Gratings," published by R. Kashyap, A. Swanton, D. J. Armes in Electronic Litters, v.32, No. 13, pp. 1226-1228, (1996).

"Fiber Bragg Gratings," published by A. Othonos, K. Kalli in Artech House, Boston-London, pp. 197-205 (1999).

"Wavelength Demultiplexing With Volume Phase Holograms in Photorefractive Lithium Niobate," published by S. Breer and K. Buse in Appl. Phys. B, v. 66, pp. 339-345 (1998).

"Multiple Storage of Thick Phase Holograms in LiNbO3," published by D. Staebler, J. Amodei and W. Phillips in Journal of Quantum Electronics, v. QE-8, No. 6, pp. 611-611 (?) (1972).

"1ms Long Pulse Nd:YAG Laser with Loop PCM," by A. A. Betin, S. C. Matthews, and M. S. Mangir paper CWKI presented at CLEO 1997, p. 283, 1997.

* cited by examiner

OUTCOUPLER WITH BRAGG GRATING AND SYSTEM AND METHOD USING SAME

REFERENCE TO RELATED APPLICATION

This application is a Divisional of U.S. patent application Ser. No. 10/860,468, entitled OUTCOUPLER WITH BRAGG GRATING AND SYSTEM AND METHOD USING SAME, filed Jun. 2, 2004 now abandoned, by A. A. Betin et al.

BACKGROUND OF THE INVENTION

1. Field of the Invention

The present invention relates to optics. More specifically, the present invention relates to outcouplers for master oscillator power amplifier (MOPA) systems.

2. Description of the Related Art

A High Energy Laser (HEL), because of its rapid time of flight, pointing agility, precision, lack of collateral damage effects, and lack of traceable residue, is an effective weapon against a broad range of military targets. One currently advantageous high energy laser is a PCMOPA (Phase Conjugate Master Oscillator Power Amplifier). The PCMOPA is described and claimed in U.S. patent application Ser. No. 10/340,277 entitled Self-Adjusting Interferometric Outcoupler And Method, filed Jan. 10, 2003 by A. A. Betin et al. the teachings of which are hereby incorporated herein by reference. PCMOPAs currently require a device called an 'outcoupler' to output a high power laser beam. This 'outcoupler' must output the beam without affecting a reference beam output by the PCMOPA.

The basic phase conjugate (PC) MOPA architecture uses a small master oscillator, which delivers a low-power single-mode reference beam through an optical input/output coupler element (outcoupler) to the output end of a high power amplifier beamline. The beam is then amplified to medium power, picking up thermal lensing and wedging aberrations and is depolarized due to thermal stress birefringence. At this point the beam enters a phase conjugate mirror, which reverses the wavefront of the beam. The reflected, phase conjugate beam then makes a return pass through the aberrated amplifier beamline and the original wavefront is restored. A high power, high beam quality beam is delivered via the outcoupler.

One of the most critical components in this PC MOPA laser architecture is the outcoupler, which is responsible for inserting the low power master oscillator beam into the amplifier beamline and extracting the amplified beam from the beamline in a separate path. Ideally, the outcoupler would insert the oscillator beam with zero loss, extract the amplified beam with zero feedback into the oscillator, and generate no distortions that cannot be corrected by the phase conjugate mirror (PCM). Several outcoupler schemes have been developed and used with the PC MOPA architecture.

One approach involved the use of a simple beamsplitter as an outcoupler. However, with this scheme, a substantial amout of power is returned to the master oscillator and has a tendency to interfere with the reference beam generated thereby. Other approaches have involved a separation of the high energy and the reference beams. One approach, for example, uses a Faraday rotator to rotate the polarization of one of the beams. Unfortunately, Faraday rotators can not currently be scaled to the high power levels needed for current and future applications.

Another approach involves the use of a frequency/wavelength discrimination scheme. This approach typically involves the use of Stimulated Brillouin Scattering (SBS) based phase conjugator and an interferometer to create a constructive interference in one direction and a destructive interference in the other. However, this approach is limited in application and may not be used with the advantageous loop phase conjugate mirror (LPCM) based system.

Another approach was described in U.S. patent application Ser. No. 10/340,277 entitled Self-Adjusting Interferometric Outcoupler And Method, filed Jan. 10, 2003 by A. A. Betin et al. the teachings of which are hereby incorporated herein by reference. This approach proposes the use of a number of Mach-Zender interferometers to determine and control the frequencies of the master oscillator and the loop PCM to achieve the necessary frequency separation. Unfortunately, the interferometers are not easy to use and may be difficult to use with aberrated beams.

Hence, there is a need in the art for a more robust, scalable, element to serve as an outcoupler capable or working with a variety of conjugators including a loop type conjugator.

SUMMARY OF THE INVENTION

The need in the art is addressed by the outcoupler of the present invention. Generally, the inventive outcoupler includes a wavelength selective, angle sensitive element and an arrangement for maintaining the element in a predetermined orientation relative to an incident beam of electromagnetic energy.

In the specific implementation, the element is a Bragg grating which may be reflective or transmissive. The inventive outcoupler may be used to implement a power amplifier. A teaching is provided herein by which a power amplifier is implemented with an oscillator; a resonator in operational alignment with the oscillator; and an outcoupler in alignment with the oscillator, the outcoupler including a Bragg grating. Preferably, second and third Bragg gratings are included within the oscillator and the resonator, respectively. In the best mode, the resonator is a loop phase conjugate mirror with a Faraday diode in alignment with the oscillator.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
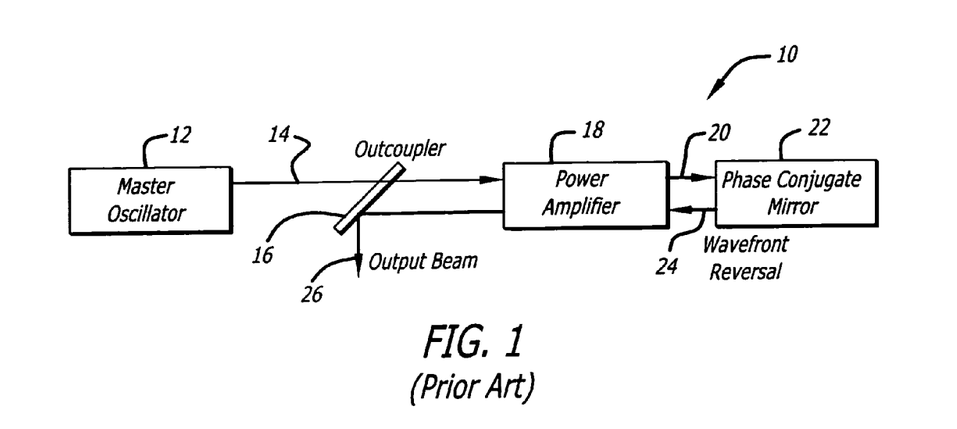
FIG. 1 is a simplified optical schematic of a basic phase conjugate MOPA configuration of conventional design and construction.

FIG. 1 is a simplified optical schematic of a basic phase conjugate (PC) master oscillator/power amplifier (MOPA) configuration 10 of conventional design and construction. A small master oscillator 12 delivers a low-power, single transverse mode reference beam 14 through an optical input/output coupler element (hereinafter outcoupler) 16 to the output end of a high power amplifier beamline 18. The beam is amplified to medium power, picking up thermal lensing and wedging aberrations and is depolarized due to thermal stress birefringence. At this point the amplified beam 20 enters a phase conjugate mirror 22, which reverses the wavefront of the incident beam. The reflected, phase conjugate beam 24 then makes a return pass through the aberrated amplifier beamline 18 and the original wavefront is restored. A high power, high beam quality beam 26 is delivered via the outcoupler 16.

This two-pass PC MOPA architecture has been successfully used on numerous programs to enhance the brightness and reduce the beam wander of solid-state lasers. Self-pumped PCM devices based on stimulated Brillouin scattering (SBS) have been used in the past for high peak power (Q-switched) devices. Attempts to apply the SBS PCM to continuous wave (CW) or quasi-CW beams have not resulted in any practical solutions. In the late 1980s a new type of phase conjugate mirror was demonstrated in Russia for high power $CO_2$ lasers. This new conjugator is based on a thermal nonlinearity in liquids and, unlike SBS, is suitable for CW operation. This has been developed as a "vector" loop PCM for correction of depolarized beams.

Figure 2:
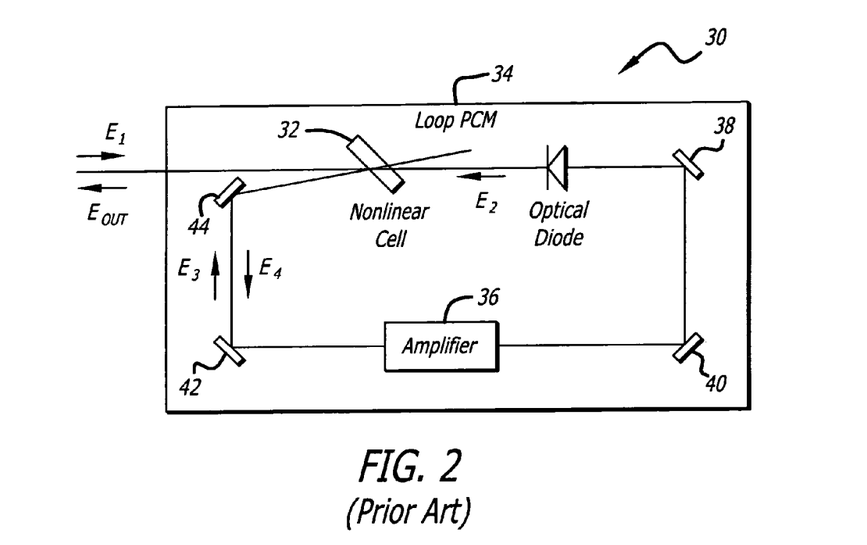
FIG. 2 is an optical schematic of a loop PCM based on a thermal nonlinearity.

FIG. 2 is an optical schematic of a loop PCM 30 based on a thermal nonlinearity. The input beam (denoted $E_1$) from the amplifier beamline enters a nonlinear medium 32 and traverses the loop in a clockwise direction. An optical diode 34 is used to prevent saturation of the gain medium (amplifier) 36 in this direction. Two mirrors (38, 40) direct the beam to an amplifier 36. This clockwise beam $E_3$ is directed by two more mirrors (42, 44) back into the nonlinear medium 32 where it interferes with the input beam $E_1$ and writes real-time holographic gratings in the medium. The grating serves as a holographic resonator mirror, which allows a laser mode $E_2$ to build from noise in the preferred counterclockwise direction around the loop. A portion of this beam $E_{OUT}$ is coupled out of the PCM through the grating in the nonlinear medium 32, in the opposite direction to the input beam $E_1$. Under the proper conditions, the grating is set up such that the output beam $E_{OUT}$ is a phase conjugate replica of the input beam $E_1$. Using this basic PC MOPA architecture in a vector (or polarization-correcting) configuration, near-diffraction limited restoration with very severe optical aberrations (100×D.L.) and near-perfect birefringence correction (>20 dB contrast) with completely depolarized beams can be achieved.

The loop PCM configuration is described more fully in the following references the teachings of which are incorporated by reference herein.

1. "Phase Conjugation Based On Thermal Nonlinearity," paper NThB1 presented by A. A. Betin at *Nonlinear Optics: Materials, Fundamentals, and Applications Conference*, Maui, Hi., pp. 336-339, July 1996.
2. "Phase Conjugation of Depolarized Light with a Loop PC", published by A. A. Betin, S. C. Matthews, and M. S. Mangir in *Nonlinear Optics: Materials, Fundamentals, and Applications Conference*, Kauai, Hi., July 1998.
3. U.S. Pat. No. 5,726,795; issued Mar. 10, 1998 to A. A. Betin, M. S. Mangir, and D. A. Rockwell, entitled COMPACT PHASE-CONJUGATE MIRROR UTILIZING FOUR-WAVE MIXING IN A LOOP CONFIGURATION.
4. U.S. Pat. No. 5,729,380; issued Mar. 17, 1998 to A. A. Betin and M. S. Mangir and entitled LOOP PHASE-CONJUGATE MIRROR FOR DEPOLARIZED BEAMS.
5. U.S. Pat. No. 6,278,547; issued Aug. 21, 2001 to A. A. Betin and entitled POLARIZATION INSENSITUVE FARADAY ATTENUATOR.

References 2, 4 and 5 describe a vector configuration which corrects for depolarization.

As discussed above, one of the most critical components in the PC MOPA laser architecture is the outcoupler (OC), which is responsible for inserting the low power master oscillator beam into the amplifier beamline and extracting the amplified beam from the beamline in a separate path. Ideally, the OC would insert the oscillator beam with zero loss, extract the amplified beam towards the output with zero feedback into the oscillator, and generate no distortions that cannot be corrected by the LPCM. Several OC schemes have been developed and used with the PC MOPA architecture. The Scalable High Energy Raman Laser (SHERL) and used a Brewster plate in conjunction with a quarter wave plate for polarization outcoupling. This scheme is disclosed by Hans W. Bruesselbach in U.S. Pat. No. 4,734,911, entitled EFFICIENT PHASE CONJUGATE LASER dated Mar. 29, 1988, the teachings of which are incorporated herein by reference. This approach provided very efficient transmission of the amplified beam with low oscillator feedback. However, it was not efficient at injecting the oscillator beam into the amplifier beamline and therefore required a higher power oscillator than would be required with an ideal outcoupler.

Figure 3:
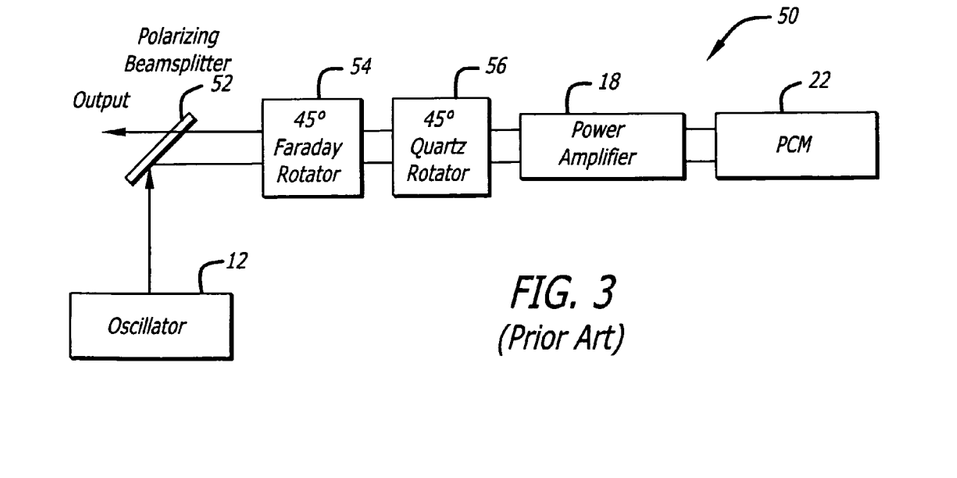
FIG. 3 is a schematic of a conventional Faraday rotator and polarization beamsplitter outcoupler approach of a lower power PC MOPA system.

Lower power PC MOPA systems utilized a polarizing beamsplitter in conjunction with a permanent-magnet Faraday rotator and quartz rotator combination to provide a non-reciprocal optical path for efficient outcoupling, as shown in FIG. 3.

FIG. 3 is a schematic of a conventional Faraday rotator and polarization beamsplitter outcoupler approach of a lower power PC MOPA system 50. The beam from the master oscillator 12 is reflected off a polarization beamsplitter 52 through a permanent-magnet Faraday rotator 54 and quartz rotator 56 combination to the power amplifier 18 and PCM 22. On the return pass, the beam is output through the polarization beamsplitter 52. The Faraday rotator and polarization beamsplitter approach works well at average powers up to a kilowatt, but Faraday devices able to handle substantially higher powers are not known to be available. The HEL application, however, calls for hundreds of kilowatts to megawatts of average power, which is beyond the current state-of-the-art in Faraday devices.

Figures 4A, 4B:
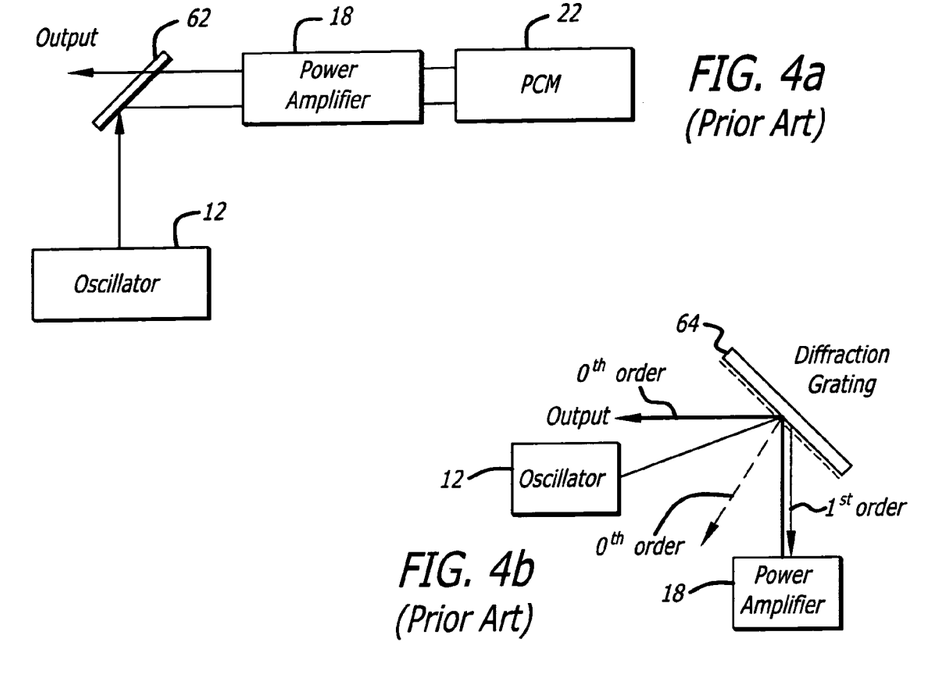
FIG. 4a is a schematic of a conventional high power outcoupler approach based on reflective/refractive beamsplitters.
FIG. 4b is a schematic of a conventional high power outcoupler approach based on diffraction gratings.

The most straightforward OC approaches for high power are based on reciprocal optical elements such as reflective/refractive beamsplitters and diffraction gratings, as shown in FIG. 4. These devices are designed to promote efficient outcoupling for the high power beam. The coupling efficiency of the master oscillator input path, however, may be very low for these devices, necessitating a relatively high power master oscillator. High oscillator power is problematic for two reasons: (1) reduced overall efficiency of the MOPA and (2) difficulty in obtaining high oscillator beam quality.

FIGS. 4a and 4b are schematic diagrams of PC MOPA architectures using conventional high power outcoupler approaches based on reflective/refractive beamsplitters and diffraction gratings, respectively. In FIG. 4a, the beam from the master oscillator 12 is reflected off a reflective/refractive beamsplitter 62 and directed to the power amplifier 18 and PCM 22. On the return pass, the amplified beam is output through the beamsplitter 62. In FIG. 4b, the beam from the master oscillator 12 is split into a two orders by a diffraction grating 64. The $1^{st}$ order is directed to the power amplifier 18 and the $0^{th}$ order is lost. On the return pass, the $0^{th}$ order of the amplified beam from the diffraction grating 64 is output. The diffraction grating has an advantage over the reflective/refractive beamsplitter in that the outcoupler-induced optical distortions are compensated, minimizing the non-common path errors for high power operation.

The diffraction grating (FIG. 4b) has an advantage over the reflective/refractive beamsplitter (FIG. 4a) in that the OC-induced optical distortions are compensated, minimizing the non-common path errors for high power operation. The coupling efficiency of the master oscillator input path, however, may be very low for these devices, necessitating a relatively high power master oscillator. While this low input coupling efficiency does not appreciably affect the overall efficiency of the laser system, higher-power master oscillators of diffraction-limited beam quality do entail an additional development risk and add to the size and weight of the system.

Non-Faraday OC techniques based on non-reciprocal interferometric elements have been proposed/developed which show promise in scaling to weapon-class power levels. In the early 1990s, several high average power interferometric OC configurations were proposed, which rely on the Stokes frequency shift inherent in the stimulated Brillouin scattering (SBS) phase conjugation process to create a non-reciprocal optical path. The first disclosed by T. O'Meara in U.S. Pat. No. 5,126,876, entitled MASTER OSCILLATOR POWER AMPLIFIER WITH INTERFERENCE ISOLATED OSCILLATOR dated Jun. 30, 1992 the teachings of which are incorporate herein by reference uses a Mach-Zender interferometer as the outcoupling element directly. This interferometer is used as the non-reciprocal element to separate the input and output paths through constructive interference in one direction and destructive interference in the other, as shown in FIG. 5.

Figure 5:
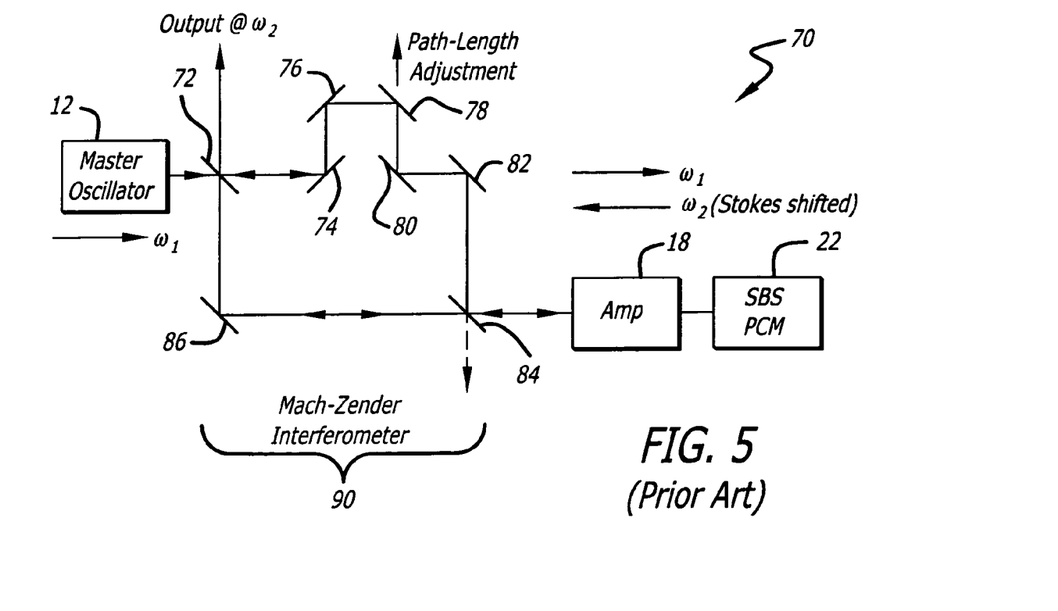
FIG. 5 is a schematic of a PC MOPA system using a conventional interferometric outcoupler scheme.

FIG. 5 is a schematic of a PC MOPA system 70 using a conventional interferometric outcoupler scheme as disclosed by O'Meara in U.S. Pat. No. 5,126,876. This approach uses a Mach-Zender interferometer 90 as the outcoupling element directly. The interferometer 90 is used as the non-reciprocal element to separate the input and output paths through constructive interference in one direction and destructive interference in the other. An input beam from the master oscillator 12 is received by a first beam splitter 72 and split into two paths, one towards a mirror 82 and another towards a mirror 84. One path includes several additional mirrors (74, 76, 78, 80) for adjusting the path-length. Beams from both paths are combined at a second beamsplitter 84 and directed to the amplifier 18 and SBS PCM 22. On the return pass, the amplified beam is split into the same two paths by the second beamsplitter 84, and output through the first beamsplitter 72. This approach relies on the Stokes frequency shift inherent in the stimulated Brillouin scattering (SBS) phase conjugation process to create a non-reciprocal optical path. Because the Stokes shift is fixed by the material parameters of the SBS medium (determined by sound velocity), the wavelength of the master oscillator ($\lambda_1$) and the length of the interferometer legs must be controlled to ensure good master oscillator isolation and input/output coupling efficiency.

The second interferometric approach uses the interferometer in the phase conjugate leg to effect a 90 degree polarization rotation on the output pass, which creates a non-reciprocal path through a polarization beamsplitter. The operation of this interferometric polarization outcoupler is disclosed in Basov et al, "Laser Interferometer with Wavelength-Reversing Mirrors," *Sov. Phys. JTEP*, Vol. 52, No. 5, November 1980, pp 847-851. Inventive improvements to this basic scheme were disclosed by D. Rockwell in U.S. Pat. No. 5,483,342, entitled "Polarization Rotation with Frequency Shifting Phase Conjugate Mirror and Simplified Interferometric Output Coupler," issued Jan. 9, 1996, the teachings of which are incorporated herein by reference.

Figure 6:
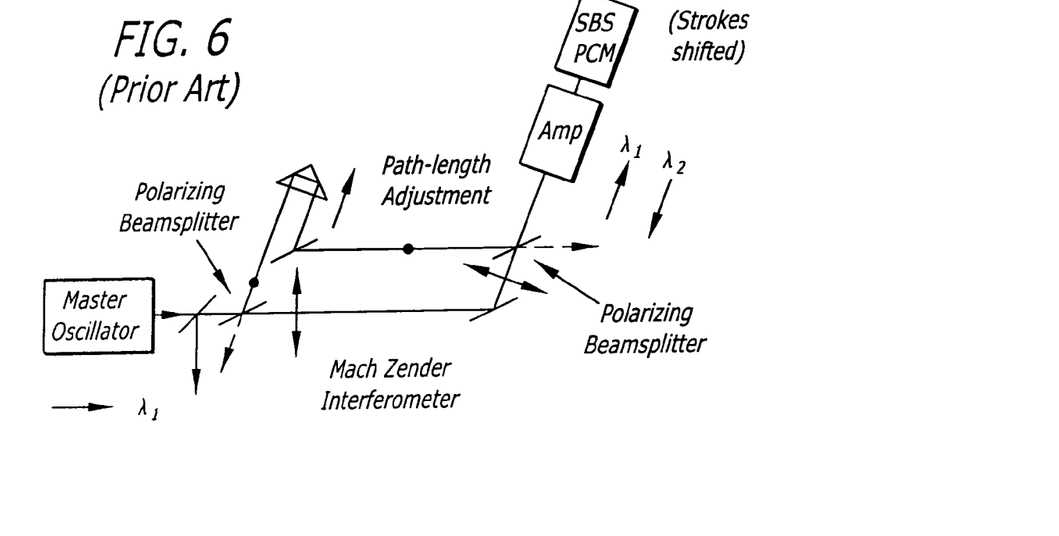
FIG. 6 is a block diagram of a polarization outcoupler scheme using an interferometer and an SBS for non-reciprocal polarization rotation in accordance with conventional teachings.

FIG. 6 is a block diagram of a polarization outcoupler scheme using an interferometer and an SBS for non-reciprocal polarization rotation in accordance with conventional teachings. This arrangement was disclosed by D. Rockwell in the above referenced U.S. Pat. No. 5,483,342.

A problem with these interferometric outcoupler approaches is that they must be used with a PCM that which has a fixed and predetermined frequency shift, typically an SBS PCM. The SBS PCM has several disadvantages: it does not work well with continuous waveforms, and it requires high peak power but cannot handle high average power. Furthermore, the prior art interferometric outcoupler approaches are sensitive to length changes in the interferometer optical paths resulting from thermal expansion and warping of the structure, plastic deformation and creep, shock and vibration induced structural compliance, or refractive index changes of the optics and intervening atmosphere, as well as any changes in the frequency of operation of the oscillator or phase conjugate mirror.

Figure 7:
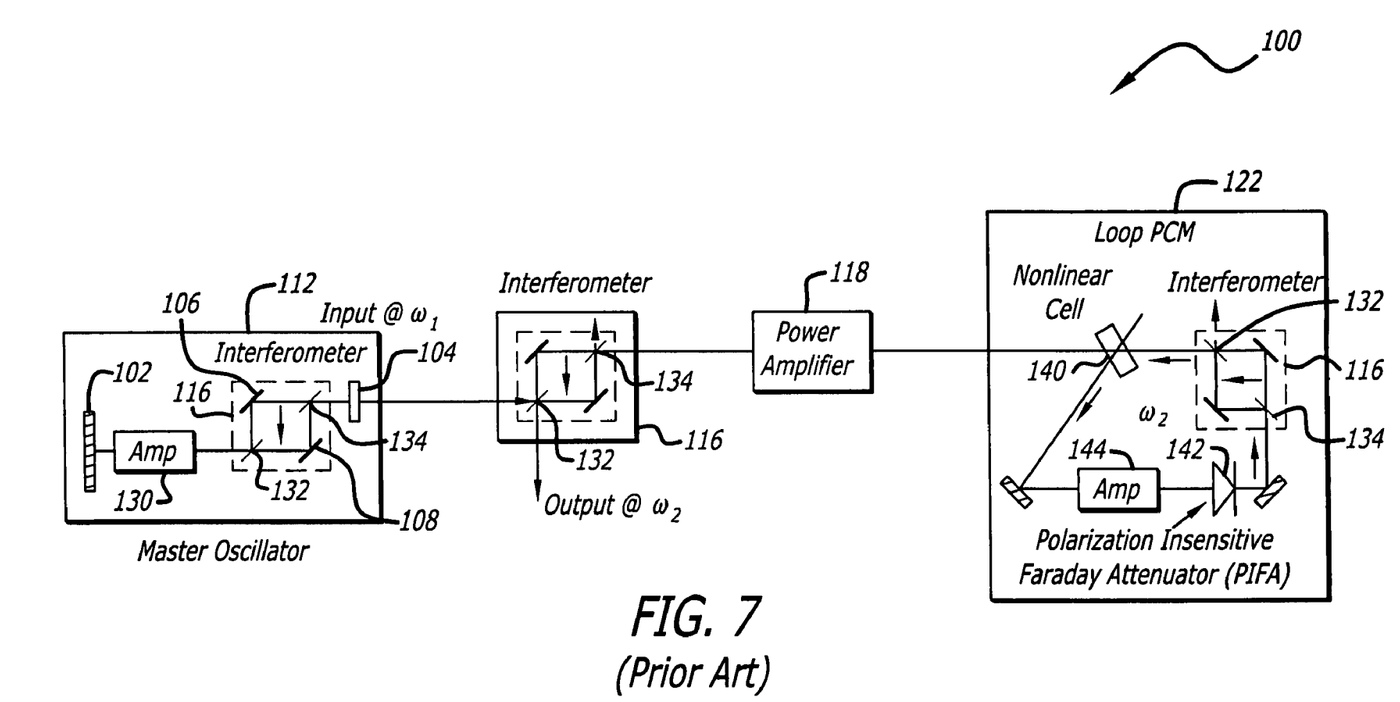
FIG. 7 is a simplified optical schematic of a MOPA system with a self-adjusting interferometric outcoupler scheme designed in accordance with teachings of U.S. patent application Ser. No. 10/340,277 entitled Self-Adjusting Interferometric Outcoupler And Method, filed Jan. 10, 2003 by A. A. Betin et al.

FIG. 7 is a simplified optical schematic of a MOPA system 100 with the self-adjusting interferometric outcoupler scheme designed in accordance with teachings of U.S. patent application Ser. No. 10/340,277 entitled "Self-Adjusting Interferometric Outcoupler And Method," filed Jan. 10, 2003 by A. A. Betin et al. the teachings of which are hereby incorporated herein by reference. In this implementation, a Mach-Zender interferometer 116 functions as a wavelength-dependent optical switch. The same interferometer 116 is used to satisfy three separate functions. This system offers substantial improvements made over the prior art described above, namely because 1) it does not rely on the Stokes frequency shift in SBS and therefore can be used with other phase conjugation media and methods, such as thermal nonlinearity in a loop configuration or four-wave mixing (FWM), 2) it uses a single interferometer to control the master oscillator frequency, control the frequency shift in the phase conjugated beam, and perform the input/output coupling within the MOPA, and this interferometer does not require tight tolerances since it is always self-tuned. In this implementation, the Mach-Zender interferometer, which is labeled an "interferometer" in FIG. 7, automatically determines and controls the frequencies of the master oscillator and LPCM. As an outcoupler it functions as a wavelength-dependent optical directional switch. For simplicity, the interferometer 116 is shown in FIG. 7 as three separate functional elements, but in practice it is actually just one physical device and the optical train is folded such that the same interferometer is shared by the oscillator 112, PCM 122, and PC MOPA outcoupler 116.

There is at least one detrimental aspect of these interferometer based input/output coupling schemes. In order to work with aberrated beams they rely on the use of re-imaging optical elements so that the two beamsplitters within the interferometer are at conjugate planes (one imaged onto the other), which adds some complexity in reducing this approach to practice.

In accordance with the present teachings, a thick holographic grating element is used as a frequency/wavelength sensitive dispersive element within a PC MOPA. This allows self-adjusting of the wavelengths of a master oscillator and a conjugator (loop PCM or four-wave mixing PCM), as well as a decoupling of the high power output beam from the PC MOPA laser system. The advantage relative to the prior art is simplicity and ease of implementation and the possibility of working with highly aberrated beams without the need for special optics.

In accordance with the present teachings, a thick Bragg grating is used in a master oscillator (MO), loop phase conjugate mirror (LPCM) and outcoupler (OC) in a PC MOPA laser system for control and self-adjusting of frequencies of the MO and LPCM and for angular separation of the input and output beams in the OC.

Figure 8:
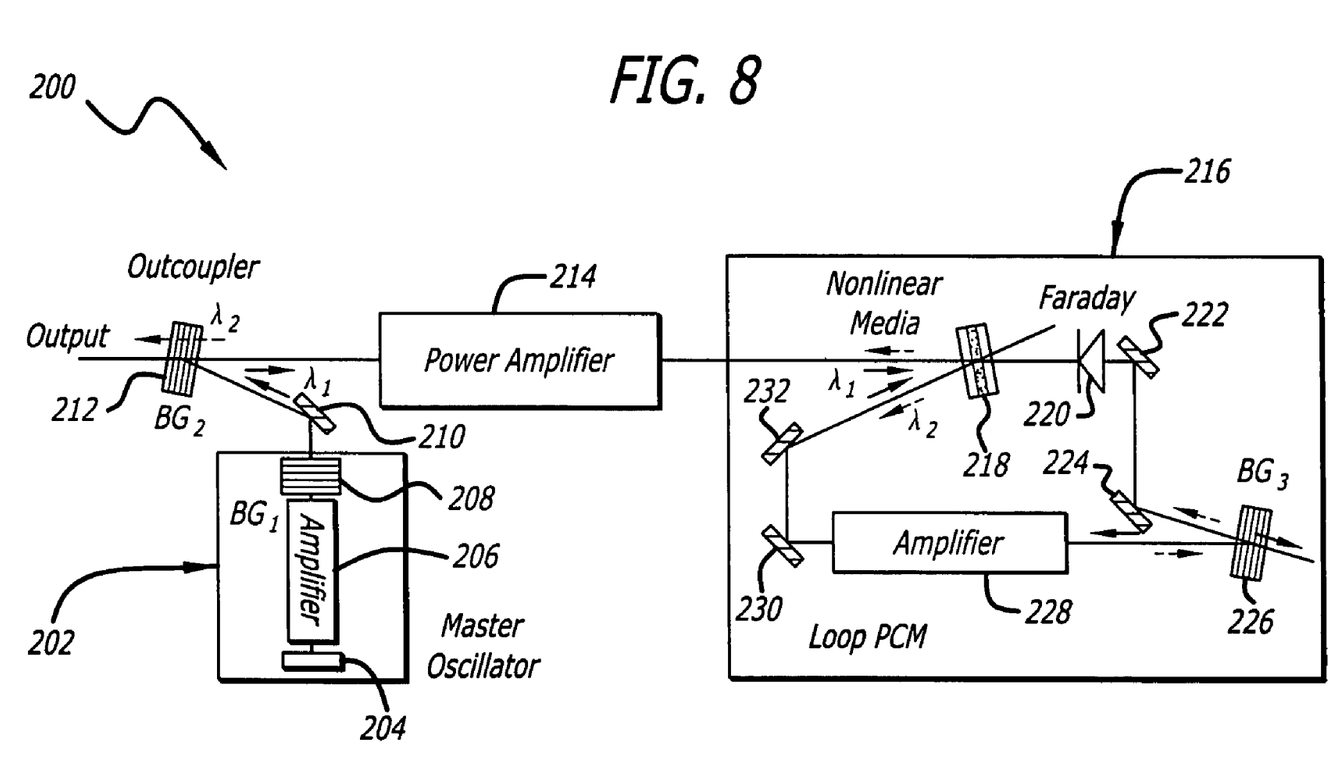
FIG. 8 is a PC MOPA with a wavelength self-adjusted outcoupler scheme using thick Bragg gratings in a accordance with an illustrative embodiment of the present teachings.

FIG. 8 is a PC MOPA with a wavelength self-adjusted outcoupler scheme using thick Bragg gratings in a accordance with an illustrative embodiment of the present teachings. As is known in the art, Bragg gratings are wavelength selective, angle sensitive reflective elements. As shown in FIG. 8, three thick reflective Bragg gratings 208, 212, and 226 are mounted in predetermined angular orientations with respect to an incident beam with conventional mounting mechanisms (not shown). The first grating 208 ($BG_1$) is placed in an MO 202 as a narrow-band high reflective mirror to define the MO operating wavelength $\lambda_1$. A second grating 212 ($BG_2$), used as the OC, is designed to provide a high reflection coefficient in the vicinity of the MO wavelength $\lambda_1$ at some particular incident angle that enables the efficient coupling of the MO laser beam toward a power amplifier 214 and LPCM 216. A third grating 226 ($BG_3$), placed in the loop PCM 216, is designed to give only partial reflection (10-50%) for the MO beam at wavelength $\lambda_1$ and at a particular angle of incidence. The third grating $BG_3$ should have a high reflectivity (near 100%) at a shifted wavelength $\lambda_2$ and at the same angle of incidence. Thus, the grating $BG_3$ should be made in such a way that wavelength $\lambda_2$ corresponds to the maximum, near 100% reflectivity. However, the MO wavelength $\lambda_1$ is assumed to be on the other local peak, providing some lower reflectivity of $BG_3$ at a wavelength $\lambda_1$. Maximum reflectivity of $BG_3$ at $\lambda_2$ assures that the LPCM would only operate at this wavelength. The difference in wavelengths should be sufficient such that the wavelength $\lambda_2$ is beyond the reflectivity bandwidth of the grating $BG_2$; this will assure the high power return beam at wavelength $\lambda_2$ will be transmitted through the OC/$BG_2$, forming the output beam without any substantial feedback into the MO.

Another important consideration for the grating $BG_3$ comes from the fact that both counter propagating laser beams (the incoming MO beam and the LPCM generated return circulating within the LPCM) are highly aberrated and may have large angular divergences. The grating $BG_3$ should be able to provide a near uniform reflectivity at both wavelengths and within large enough angular spread (up to 50×DL is enough for most practical applications). In this case no amplitude distortions will be imposed onto these highly aberrated beams; an important condition for achieving high PC fidelity in the LPCM.

In operation, a beam from the amplifier 206 of the MO 202 exits the first grating 208 at wavelength $\lambda_1$, is reflected by mirror 210 to the second grating 212 and is reflected by the second grating to the loop PCM through the power amplifier 214. In the loop PCM, the beam passes through the nonlinear medium 218 and the Faraday diode 220 and is reflected by mirrors 222 and 224 onto the third Bragg grating 226. A portion of the energy of the beam is reflected by the third grating to the PCM amplifier 228 through which it passes to the nonlinear medium 218 via fourth and fifth mirrors 230 and 232 respectively. At the nonlinear medium, the beam interferes with the beam at $\lambda_1$ from the power amplifier 204 and creates a hologram which reflects a return beam at wavelength $\lambda_2$. The return beam is amplified by the PCM amplifier 228 and reflected by the third Bragg grating 226 and mirrors 224 and 222 to the Faraday diode 220. The return beam at $\lambda_2$ passes through the diode 220 and the power amplifier and is output by the second Bragg grating 212 which serves as the outcoupler for the system.

The wavelength difference, $\Delta\lambda = \lambda_1 - \lambda_2$, cannot be arbitrary large for two major reasons. One is that it should be less than the amplifier gain spectral bandwidth, which depends on a gain medium. Solid state laser crystals like Yb:YAG, Nd:YAG, etc. have gain bandwidth in excess of 1 nm. For glass laser media, the gain bandwidth can be more then 10 nm.

Another reason is that a large difference in wavelengths can cause the two aberrated/speckled beams (the incoming beam to the PCM and the conjugated return) to de-correlate from each other. This may negatively impact the phase conjugation fidelity and the compensation of optical distortions in the power amplifier may not be complete.

If we estimate the wavelength difference for two aberrated beams with wave numbers $k_1$ and $$k_2 \left( k = \frac{2\pi}{\lambda} \right)$$

which can still provide a good phase conjugation compensation in a amplifier with length L and if the transverse correlation length of laser beam is $\rho$, then the longitudinal correlation length along the beam propagation direction is $k\rho^2$ and de-correlation of two beams occurs when:

$$\left| \frac{L}{k_1 \rho^2} - \frac{L}{k_2 \rho^2} \right| \approx 1 \quad [1]$$

$$|\Delta k| \approx \frac{\rho^2 k^2}{L}$$

where $k=(k_1+k_2)/2$ and $\Delta k=k_2-k_1$.

Since $$\Delta k = -2\pi \frac{\Delta \lambda}{\lambda^2} \text{ and } \frac{\theta}{2\sqrt{2}} = \frac{1}{k\rho},$$

where $\theta$ is a divergence of the beam ($FW^1/_e{^2}M$), then:

$$|\Delta \lambda| \approx \frac{4\lambda^2}{\pi \theta^2 L}. \quad [2]$$

Introducing an etendue, $E=D\theta$, a parameter, which is used to characterize a quality of laser beams (D is a beam size):

$$|\Delta \lambda| \approx \frac{4\lambda^2 D^2}{\pi E^2 L}. \quad [3]$$

Consider an example of a small amplifier with D×L~1 mm×100 mm and a laser beam propagating in an amplifier medium with etendue 50 mm×mrad (equals to an etendue of approximately 100 mm×mrad for the beam propagating in air, if one takes into account a refractive index of an amplifier laser medium). Calculation results in:

$$|\Delta \lambda| \approx \frac{4 \cdot 10^6 \text{ nm}^2 \cdot 10^{12} \text{ nm}^2}{3.14 \cdot 0.25 \cdot 10^{-2} \cdot 10^{12} \text{ nm}^2 \cdot 10^8 \text{ nm}} \approx 5 \text{ nm}. \quad [4]$$

The estimate based on assumption [1] works reasonably well for very large diameter speckled beams. For more realistic case, one can expect that a much larger wavelength difference may be allowed without substantial problems for phase conjugation. Thus, one can conclude that $\Delta \lambda >> 1$ nm is allowable in practical applications.

Suitable Bragg gratings, transmissive and/or reflective, can be made by known processes of recording gratings in photosensitive media, such as glasses or crystals. See "High-Efficiency Bragg Gratings In Photothermo-Refractive Glass," published by O. M. Efimov, L. B. Glebov, L. N. Glebova, K. C. Richardson, V. I. Smirnov in Appl. Opt., v. 38, No. 4, pp. 619-627 (1999).

Angular and wavelength dependencies of diffraction efficiency for these gratings are calculated in accordance with the well-known Kogelnik's theory. See "Coupled Wave Theory for Thick Hologram Gratings," published by H. Kogelnik in *The Bell System Technical Journal*, v. 48, No. 9, pp. 2909-2945, (1969). Usually a dependence of diffraction efficiency on wavelength or angle exhibits a lot of sidelobes. However, there are techniques for effective suppression of the sidelobes. See "Simple Technique for Apodising Chirped and Unchirped Fiber Bragg Gratings," published by R. Kashyap, A. Swanton, D. J. Armes in *Electronic Litters*, v. 32, No. 13, pp. 1226-1228, (1996) and "Fiber Bragg Gratings," published by A. Othonos, K. Kalli in Artech House, Boston-London, pp. 197-205 (1999).

It is also possible to record more than one grating in a piece of a photosensitive material. These gratings may act independently and provide more than one local maximum in overall reflectivity spectrum. One maximum can have near 100% reflectivity and other(s) can have near 100% or lower reflectivity depending on the requirements of a given application. See "Multiple Storage of Thick Phase Holograms in $LiNbO^3$," published by S. Breer, H. Vogt, and K. Buse in Electronics Letters, v. 34, No. 25, pp. 2419-2421 (1998). Asssuming that gratings with or without sidelobes, as well as with multiple local reflectivity maximums can be made, we can identify a grating with a period $\Lambda$ and a central diffraction wavelength $\lambda=2\Lambda \cdot n$ $\sin(\Phi/2)$ (corresponding to frequency $v=c/\lambda$), where $\Lambda$ is a grating period, n is a refractive index of grating medium, c is speed of light in vacuum and $\Phi$ is an angle between incident and diffraction beams. If an operational lasing spectrum is determined only by this grating, (there may be other components in a laser resonator that impact the laser wavelength as well, e.g. the laser amplifier gain bandwidth), it may occur on a single or multiple wavelengths within the grating bandwidth. For instance, one or many longitudinal modes can be excited in MO or LPCM within a gain bandwidth of laser amplifier and supported by the bandwidth of the Bragg grating used.

Figure 9:
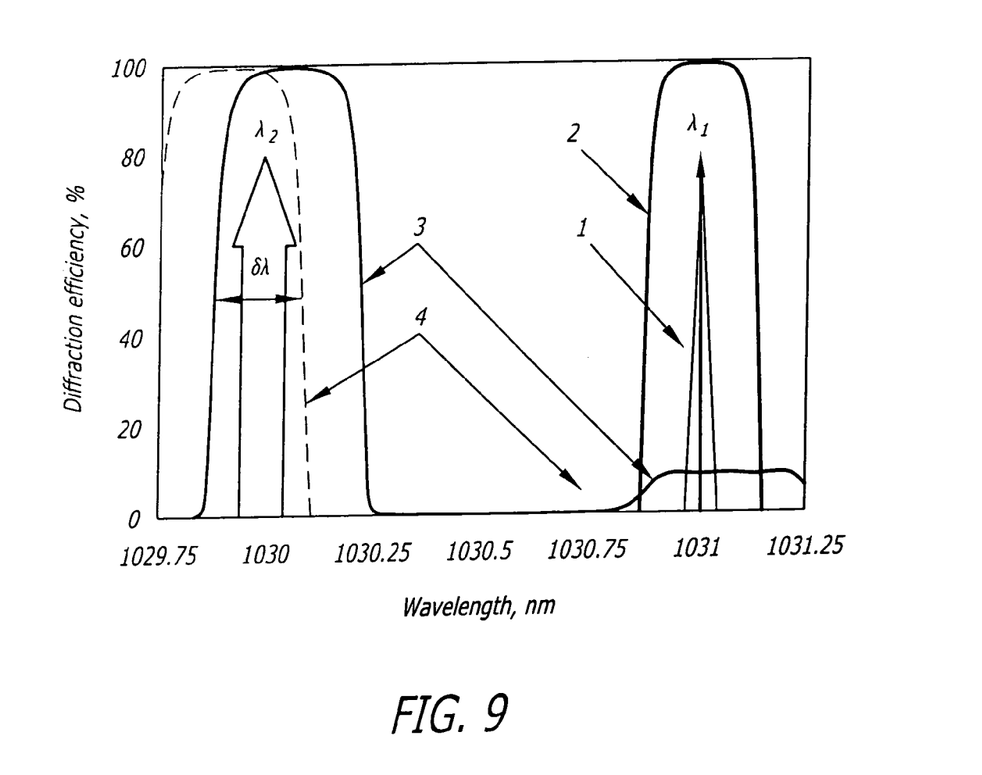
FIG. 9 demonstrates an example of possible Bragg gratings which can be fabricated to realize a PC MOPA in FIG. 8 based on use of Yb:YAG amplifiers.

FIG. 9 demonstrates an example of possible Bragg gratings which can be fabricated to realize a PC MOPA setup in FIG. 8 based on use of Yb:YAG amplifiers. In FIG. 9, the spectra of reflectivity of Bragg gratings as shown as follows: $BG_1$ (1), $BG_2$ (2), and $BG_3$ (3, 4). The thicknesses and incident angles are:

$BG_1$: thickness—10 mm, incident angle—0°;

$BG_2$: thickness is 3.5 mm, incident angle—2°;

$BG_3$: thickness is 2.5 mm, incident angles—0.5° (3) and 1.5° (4).

Similar gratings can be easily designed for other than Yb:YAG based lasers, including Nd:YAG, Nd:GGG, Er:YAG, etc.

Yb:YAG crystal has a gain bandwidth of approximately 4 nm around central peak wavelength ~1030 nm. The wavelength shift in this exemplary realization is $\Delta\lambda$~1 nm. Parameters of all Bragg gratings are given in the Table 1.

Table 1 shows parameters of Bragg gratings where 'n' is the refractive index and $2\times\Delta n$ is the maximal refractive index variation.

TABLE 1

| | Wavelength nm | Thickness mm | Incident angle deg. | $\Delta n$ | n |
|---|---|---|---|---|---|
| BG1 | 1031 | 10 | 0 | 0.00004 | 1.5 |
| BG2 | 1031 | 3.5 | 2 | 0.0003 | 1.5 |
| BG3, main grating | 1030 | 2.5 | 1 | 0.0004 | 1.5 |
| BG3, 1$^{st}$ weak grating | 1030.88 | 2.5 | 1 | 0.00004 | 1.5 |
| BG3, 2nd weak grating | 1031.01 | 2.5 | 1 | 0.00004 | 1.5 |
| BG3, 3d weak grating | 1031.14 | 2.5 | 1 | 0.00004 | 1.5 |

$BG_1$ is constructed to force the MO to operate at $\lambda_1$~1031 nm. $BG_2$ is calculated to get near 100% coupling of the MO beam into the power amplifier under launching at an angle of incidence about 2° that gives a good geometrical separation between input and output beams. $BG_3$ is designed to have one main reflectivity maximum, which gives near 100% reflectivity around $\lambda_2$~1030 nm, assuring the LPCM works at this wavelength or multiple wavelengths near the central maximum at 1030 nm within the indicated on the graph grating bandwidth $\delta\lambda$. This $\lambda_2$~1030 nm maximum is provided by recording a main single grating with parameters indicated in Table 1.

The secondary peak in reflectivity spectrum of $BG_3$ is designed by recording a few (three in the present example, see Table 1) additional weak gratings to give approximately 10-20% reflectivity (which is appropriate for typical operating conditions of a LPCM device) near wavelength $\lambda_1 \sim 1031$ nm of MO laser beam. The four gratings are recorded and overlapped in the same volume making a single $BG_3$ element. The choice of 3 weak gratings is made to provide an example of how to form a secondary maximum with near uniform reflectivity with a sufficiently wide angle of incidence, $>\delta\theta \sim 1°$.

Wavelengths $\lambda_2$ and $\lambda_1$ correspond to central peaks of both main and secondary reflectivity maximums assuming the central incident angle is 1°. For highly divergent beams different angular components of the beams will form an angular spread of incident angles. In the case with beam divergence $\theta \sim 1°$ the incident angles spread will be from 0.5° to 1.5°. However, diffraction efficiency of any Bragg grating depends on both wavelength and incident angle. Thus, dependence on wavelength is different for different angular components. This is why FIG. 9 shows the $BG_3$ reflectivity spectra for both limiting angles in order to demonstrate the possible wavelength range $\delta\lambda$ of $BG_3$ operation.

Figure 10:
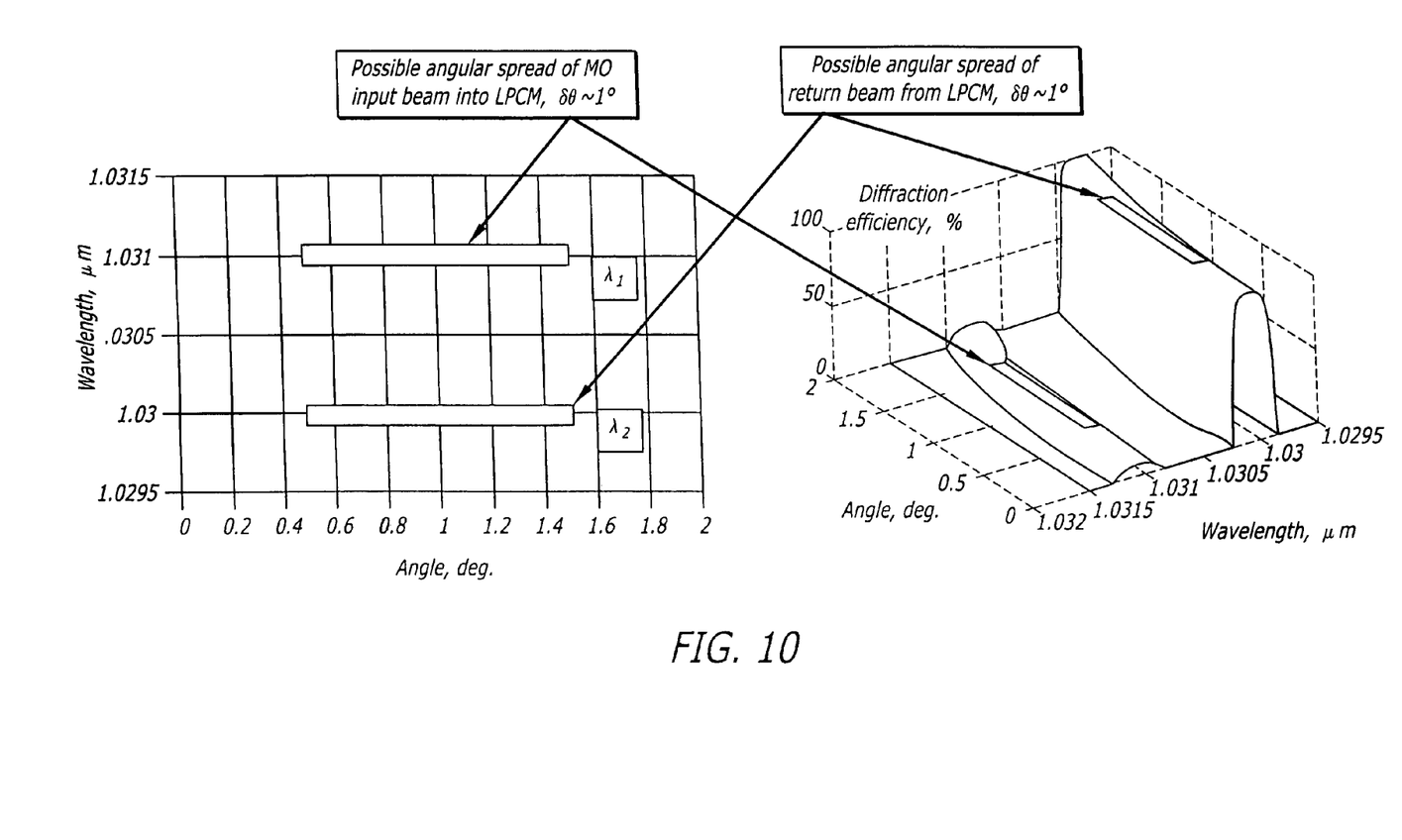
FIG. 10 shows illustrative graphs of $BG_3$ reflectivity in dependence on incident angle and wavelength.

FIG. 10 shows illustrative graphs of $BG_3$ reflectivity in dependence on incident angle and wavelength. In FIG. 10, $BG_3$: thickness—2.5 mm, central angle of incidence—1°. It is seen that the $BG_3$ provides, at both wavelengths, a near uniform reflectivity in a large angular bandwidth more than $\delta\theta \sim 1°$. Such angular bandwidth allows one to work with highly aberrated laser beams having angular divergence $\theta$ within $\delta\theta \sim 1°$ and etendue $E = D\theta \sim 100$ mm×mrad achievable for reasonable laser beam diameters $D > 6$ mm. Sufficient Bragg gratings with dimensions 10 mm×10 mm and larger can be easily manufactured.

There are other ways to make gratings with required reflectivity at MO wavelength $\lambda_1$, in addition to the method of recording a few weak gratings on top of the main grating described above. It can be a single weak grating recorded together with a main grating if a refractive index of a photosensitive material is high enough, like in $LiNbO_3$. Another way is to record a single thin grating for wavelength $\lambda_1$ positioned somewhere inside the main thick grating for wavelength $\lambda_2$. Yet another one is to use the Fresnel reflection for wavelength $\lambda_1$ from the rear surface of Bragg grating made just for getting near 100% reflectivity for wavelength $\lambda_2$. In latter case the rear surface can be coated to adjust to an appropriate reflection coefficient at wavelength $\lambda_1$. Bragg grating's design and fabrication become easier if less divergent beams are used or required.

To analyze the sensitivity of gratings to temperature variations and the reality of their use in real devices, assume the grating with period $\Lambda$ recorded in media with refractive index n and thermal expansion coefficient $\alpha$. Bragg diffraction condition leads to the relation between central wavelength $\lambda$ and period of grating $\Lambda$ (for simplicity of analysis it is assumed to be written for an angle of incidence close to a zero degree) and consecutively to the dependence of central wavelength $\lambda$ on temperature deviations:

$$\lambda = 2\Lambda n \quad [5]$$
$$d\lambda = 22(\Lambda dn + n\alpha \Lambda dT)$$

$$\frac{d\lambda}{dT} = \frac{\lambda}{n}\left(\frac{dn}{dT} + n\alpha\right) \quad [6]$$

For photosensitive glass material made by Corning: $dn/dT \sim 6 \cdot 10^{-6}$ 1/° C., $\alpha \sim 4.6 \cdot 10^{-6}$ 1/° C., the estimate gives $d\lambda/dT = 8.9 \cdot 10^{-3}$ nm/° C. Hence, in the above example, with $BG_3$ with allowable wavelength bandwidth of $\delta\lambda \sim 0.2$ nm (see FIG. 9), temperature variations can be up to $\sim 20°$ C. The allowable temperature deviation will increase with decreasing laser beam etendue, incident angle and grating thickness. Note that in the example given, temperature rise due to the heating by a powerful output laser beam will move the reflection band of the $BG_2/OC$ grating further out off of the reflection band of the LPCM $BG_3$ grating, thus sustaining a good isolation of the MO from the output powerful beam.

Figure 11:
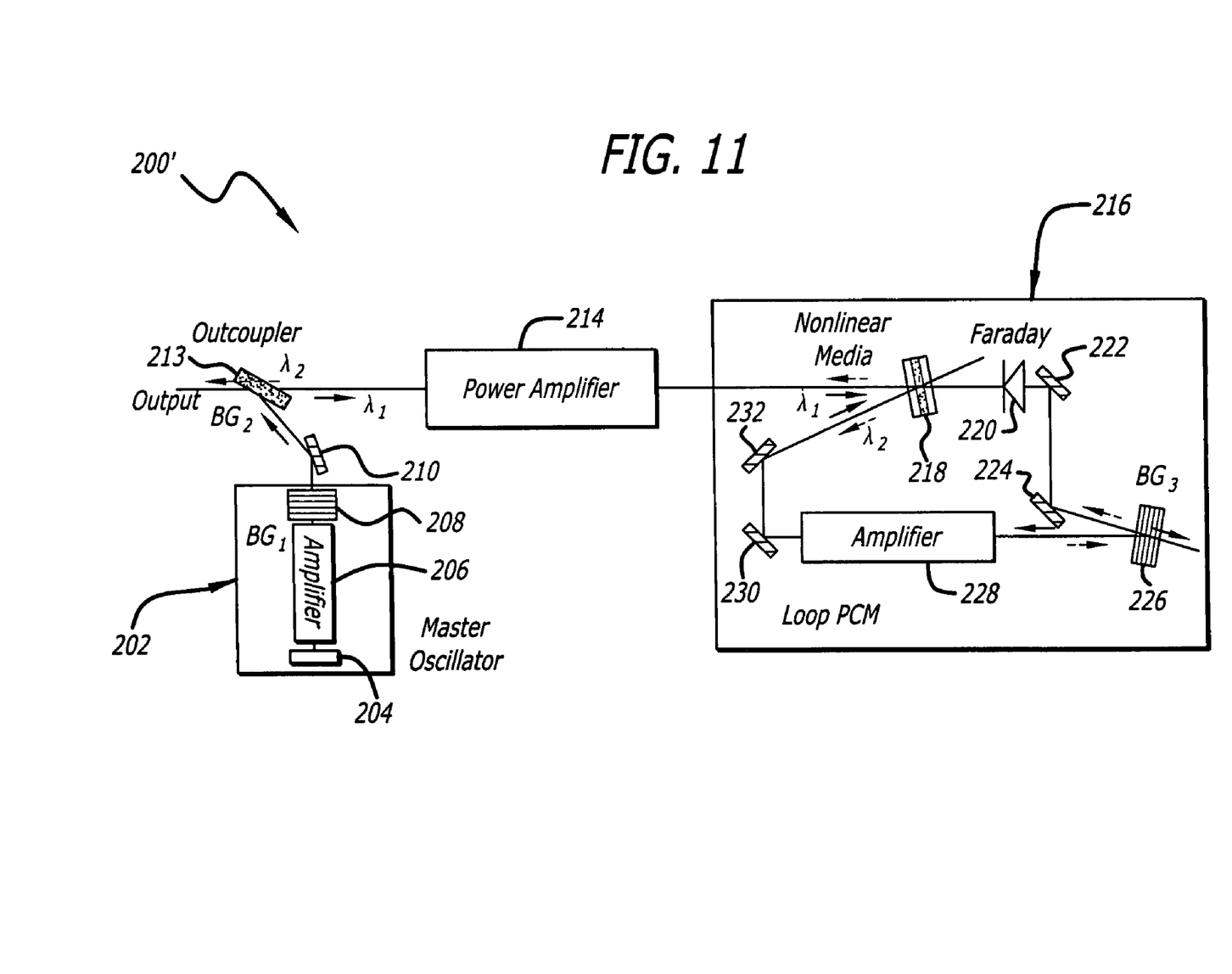
FIG. 11 is a diagram of a PCMOPA setup with a transmissive Bragg grating as an outcoupler in accordance with an alternative embodiment of the present teachings.

FIG. 11 is a diagram of a PCMOPA setup with a transmissive Bragg grating as an outcoupler in accordance with an alternative embodiment of the present teachings. That is, in this realization the outcoupler $BG_2$ (213) is implemented with a thin transmissive Bragg grating.

This arrangement has a certain advantages. Optical distortions in the $BG_2$ 213 (either previously existing or induced during operation) will be imposed onto MO laser beam traveling towards LPCM and the conjugated return from the LPCM will practically compensate these distortions and restore the original quality of the MO beam after passing through the $BG_2$ on the way back. The smaller BG thickness, diffraction angle and optical distortions lead to better compensation.

An example of $OC/BG_2$ shown on FIG. 11 may be calculated having grating thickness ~0.8 mm and angle of incidence ~60 degrees. It should provide near 100% reflectivity at ~1031 nm and substantially full transmission at 1030 nm. Note, transmission gratings have high angular selectivity resulting in very narrow spread of incident angles which, in turn, may provide extra protection for the MO by reducing scattered noise from the powerful output beam.

A system implemented in accordance with the present teachings should provide the following features:

1. It should not rely on the Stokes frequency shift in SBS, and therefore should be used with other phase conjugation media and methods, such as thermal nonlinearity in a loop configuration, or four-wave mixing (FWM).
2. It should use either a single holographic element (in a shared configuration) or multiple similar or specially tailored to each other elements to control the master oscillator frequency/wavelength and the frequency/wavelength shift in the phase conjugated beam, and to perform the input/output coupling within the PC MOPA.
3. With respect to wavelength, the overall scheme should remain self-tuned. It should not be particularly sensitive to length changes in the laser beam optical paths, which result from thermal expansion and warping of the structure, plastic deformation and creep, shock and vibration induced structural compliance, or refractive index changes of the optics.
4. It should be simple and easy to implement and it should not require complicated optical layouts when working with aberrated beams.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A laser comprising:
   an oscillator adapted to output a beam at a first wavelength $\lambda_1$;
   a power amplifier in operational alignment with said oscillator;
   a loop phase conjugate mirror adapted to reflect a beam output by said amplifier with a spectrally shifted second wavelength $\lambda_2$; and
   an outcoupler in alignment with said mirror, wherein the outcoupler is a Bragg grating positioned oblique to the master oscillator and power amplifier such that the outcoupler provides near 100% reflectivity at $\lambda_1$ and substantially full transmission at $\lambda_2$.

2. The invention of claim 1 wherein said oscillator includes a first Bragg grating for controlling said wavelength $\lambda_1$ of said beam output by said oscillator.

3. The invention of claim 2 wherein said oscillator includes an amplifier.

4. The invention of claim 1 wherein said loop phase conjugate mirror includes a second Bragg grating having a high reflectivity at said second wavelength $\lambda_2$ and partial reflectivity at said first wavelength $\lambda_1$ such that a beam at said second wavelength $\lambda_2$ is generated and output by said loop chase conjugate mirror.

5. The invention of claim 4 wherein said loop phase conjugate mirror includes a nonlinear medium adapted to receive and transmit said beam output by said power amplifier to said second Bragg grating.

6. The invention of claim 5 wherein said loop phase conjugate mirror includes an amplifier operationally disposed between said medium and said second Bragg grating.

7. The invention of claim 6 wherein said loop phase conjugate mirror includes a Faraday diode operationally disposed between said medium and said second Bragg grating.

8. The invention of claim 4 wherein said outcoupler is a third Bragg grating.

9. A laser system comprising:
   a master oscillator adapted to output a beam at a first wavelength $\lambda_1$;
   a power amplifier in operational alignment with said oscillator;
   a loop phase conjugate mirror in operational alignment with said amplifier, wherein said mirror includes a first Bragg grating having partial reflectivity at said first wavelength $\lambda_1$ and a high reflectivity at said second wavelength $\lambda_2$ such that a beam at said second wavelength $\lambda_2$ is generated and output by said mirror to said power amplifier; and
   an outcoupler in alignment with said master oscillator, said power amplifier, and said phase conjugate mirror, said outcoupler including a second Bragg grating having high reflectivity at said first wavelength $\lambda_1$ and high transmissivity at said second wavelength $\lambda_2$ and positioned to reflect said beam output by said oscillator toward said power amplifier and transmit a beam at said second wavelength $\lambda_2$ output by said power amplifier.

10. The invention of claim 9 wherein said loop phase conjugate mirror includes a Faraday diode in alignment with said power amplifier.

11. The invention of claim 10 wherein said first Bragg grating is in alignment with said diode.

12. The invention of claim 11 wherein said loop phase conjugate mirror includes a nonlinear medium operationally disposed between said diode and said power amplifier.

13. The invention of claim 12 wherein said loop phase conjugate mirror includes an amplifier operationally disposed between said medium and said first Bragg grating.

14. The invention of claim 9 wherein said oscillator includes a third Bragg grating for controlling said wavelength $\lambda_1$ of said beam output by said oscillator.

* * * * *